(12) United States Patent
Schulze et al.

(10) Patent No.: US 9,698,247 B2
(45) Date of Patent: Jul. 4, 2017

(54) METHOD OF PRODUCING A SEMICONDUCTOR ARRANGEMENT

(71) Applicant: Infineon Technologies AG, Neubiberg (DE)

(72) Inventors: Hans-Joachim Schulze, Taufkirchen (DE); Manfred Kotek, Villach (AT); Johannes Baumgartl, Riegersdorf (AT); Markus Harfmann, Villach (AT); Christian Krenn, Viktring (AT); Thomas Neidhart, Klagenfurt (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/071,962

(22) Filed: Mar. 16, 2016

(65) Prior Publication Data

US 2016/0197164 A1 Jul. 7, 2016

Related U.S. Application Data

(62) Division of application No. 13/419,469, filed on Mar. 14, 2012, now Pat. No. 9,306,010.

(51) Int. Cl.
*H01L 21/20* (2006.01)
*H01L 29/66* (2006.01)
(Continued)

(52) U.S. Cl.
CPC .... *H01L 29/66712* (2013.01); *H01L 21/2251* (2013.01); *H01L 21/6835* (2013.01);
(Continued)

(58) Field of Classification Search
CPC ........... H01L 21/0257; H01L 21/02634; H01L 21/3247
(Continued)

(56) References Cited

U.S. PATENT DOCUMENTS 3,485,684 A 12/1969 Mann et al.
3,812,519 A 5/1974 Nakamura et al.
(Continued)

FOREIGN PATENT DOCUMENTS

| CN | 1624883 A | 6/2005 |
| CN | 1840749 A | 10/2006 |
| CN | 101390216 A | 3/2009 |

OTHER PUBLICATIONS

Rai-Choudry, P. et al., "Doping of Epitaxial Silicon: Effect of Dopant Partial Pressure", Journal of Crystal Growth, 7, North Holland Publishing Co., 1970, pp. 361-367.

*Primary Examiner* — Chandra Chaudhari
(74) *Attorney, Agent, or Firm* — Murphy, Bilak & Homiller, PLLC

(57) ABSTRACT

A semiconductor arrangement is produced by providing a semiconductor carrier of a second conduction type and epitaxially growing a first semiconductor zone of a first conduction type on the carrier. The first semiconductor zone includes a semiconductor base material doped with first and second dopants which are made of different substances which are both different from the semiconductor base material. The first dopant is electrically active and causes a doping of the first conduction type in the semiconductor base material, and causes a decrease or an increase of a lattice constant of the first semiconductor zone. The second dopant causes one or both of hardening of the first semiconductor zone and an increase of the lattice constant of the first semiconductor zone if the first dopant causes a decrease, or a decrease of the lattice constant of the first semiconductor zone if the first dopant causes an increase.

8 Claims, 5 Drawing Sheets

(51) Int. Cl.
| | |
|---|---|
| *H01L 29/78* | (2006.01) |
| *H01L 29/06* | (2006.01) |
| *H01L 29/161* | (2006.01) |
| *H01L 29/167* | (2006.01) |
| *H01L 29/207* | (2006.01) |
| *H01L 21/225* | (2006.01) |
| *H01L 21/683* | (2006.01) |
| *H01L 29/10* | (2006.01) |
| *H01L 21/324* | (2006.01) |
| *H01L 29/08* | (2006.01) |
| *H01L 29/16* | (2006.01) |
| *H01L 29/20* | (2006.01) |

(52) U.S. Cl.
CPC ...... *H01L 29/0634* (2013.01); *H01L 29/0873* (2013.01); *H01L 29/1095* (2013.01); *H01L 29/161* (2013.01); *H01L 29/167* (2013.01); *H01L 29/207* (2013.01); *H01L 29/7802* (2013.01); H01L 21/3247 (2013.01); H01L 29/0878 (2013.01); H01L 29/1608 (2013.01); H01L 29/2003 (2013.01); H01L 2221/68345 (2013.01)

(58) Field of Classification Search
USPC .......................................... 438/505, 566, 919
See application file for complete search history.

(56) References Cited

U.S. PATENT DOCUMENTS

| | | | |
|---|---|---|---|
| 3,956,037 | A | 5/1976 | Ishii et al. |
| 4,332,627 | A | 6/1982 | Schmitt et al. |
| 4,629,520 | A | 12/1986 | Ueno et al. |
| 5,245,204 | A | 9/1993 | Morishita |
| 6,576,516 | B1 * | 6/2003 | Blanchard ........... H01L 29/0634 257/E21.151 |
| 7,138,291 | B2 | 11/2006 | McClure et al. |
| 7,642,178 | B2 * | 1/2010 | Yamauchi ......... H01L 21/82348 438/505 |
| 7,828,893 | B2 | 11/2010 | Mueller et al. |
| 2001/0004545 | A1 | 6/2001 | Drobny et al. |
| 2004/0041225 | A1 | 3/2004 | Nemoto |
| 2005/0124151 | A1 | 6/2005 | Cheng et al. |
| 2006/0073679 | A1 | 4/2006 | Airaksinen et al. |
| 2006/0138607 | A1 | 6/2006 | Nemoto |
| 2007/0148890 | A1 | 6/2007 | Enicks et al. |
| 2008/0001158 | A1 | 1/2008 | Das et al. |
| 2009/0001413 | A1 | 1/2009 | Gauthier, Jr. et al. |
| 2009/0045458 | A1 | 2/2009 | Iacoponi et al. |
| 2009/0325368 | A1 | 12/2009 | Shibuya et al. |
| 2012/0018732 | A1 | 1/2012 | Aida et al. |
| 2012/0032229 | A1 | 2/2012 | Deai et al. |

* cited by examiner

METHOD OF PRODUCING A SEMICONDUCTOR ARRANGEMENT

TECHNICAL FIELD

Embodiments of the invention relate to semiconductor arrangements and the production thereof.

BACKGROUND

For the production of semiconductor components, doped semiconductor substrates are used as a starting point. Typically, such a conventional semiconductor substrate is a wafer. From such a wafer, a number of semiconductor chips can be produced. Hence, the yield of semiconductor chips increases with the size of the wafer. Alternatively, only one semiconductor chip can be produced from the whole wafer, for instance a power thyristor or a power diode. In this case, an increased size of the wafer allows for the production of power semiconductor chips having an increased ampacity.

As a wafer typically has the shape of a flat, round disk, the size of a wafer usually is indicated by its diameter. At present, wafers having diameters of up to 300 mm are available on the market, but only with a p-doping. However, for the production of many kinds of semiconductor components like "drain-down" transistors it is advantageous to start on the basis of an n-doped substrate. In a drain-down" transistor, gate and source are commonly arranged on a front side of the transistor and drain on a rear side opposite the front side. In view of the above-mentioned advantages of large area semiconductor substrates there is a need for n-doped large area substrates but also for p-doped large area substrates.

SUMMARY

According to one aspect of the invention, a semiconductor arrangement includes a first semiconductor zone of a first conduction type. The first semiconductor zone is formed from a semiconductor base material doped with a first dopant and a second dopant, wherein the first and second dopants are different substances and also different from the semiconductor base material. The first dopant is electrically active and causes a doping of the first conduction type in the semiconductor base material, and causes either a decrease or an increase of a lattice constant of the pure, undoped first semiconductor zone. The second dopant also may be electrically active and may be of the same doping type (i.e. donor- or acceptor-like) as the first dopant, and causes one or both of: a hardening of the first semiconductor zone; an increase of the lattice constant of the pure, undoped first semiconductor zone if the first dopant causes a decrease, and a decrease of the lattice constant of the pure, undoped first semiconductor zone if the first dopant causes an increase, respectively.

Due to the appropriately coordinated first and second dopants, the sheet resistance of this layer can be minimized and an excessive wafer bow of the arrangement is avoided and the semiconductor arrangement can be lithographically processed.

According to another aspect, a method for producing a semiconductor arrangement includes providing a semiconductor carrier of a second conduction type and epitaxially growing a first semiconductor zone of a first conduction type complementary to the second conduction type on the semiconductor carrier. The first semiconductor zone includes a semiconductor base material doped with a first dopant and a second dopant, wherein the first dopant and second dopants are made of different substances and also of substances different from semiconductor base material. The first dopant is electrically active and causes a doping of the first conduction type in the semiconductor base material, and causes either a decrease or an increase of a lattice constant of the pure, undoped first semiconductor zone. The second dopant causes one or both of: a hardening of the first semiconductor zone; an increase of the lattice constant of the pure, undoped first semiconductor zone if the first dopant causes a decrease, and a decrease of the lattice constant of the pure, undoped first semiconductor zone if the first dopant causes an increase, respectively. Preferably but not necessarily, the second dopant is electrically active, too, and is of the same doping type (i.e. donor- or acceptor-like) like the first dopant.

Those skilled in the art will recognize additional features and advantages upon reading the following detailed description, and upon viewing the accompanying drawings.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION

In the following Detailed Description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the FIGS. being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
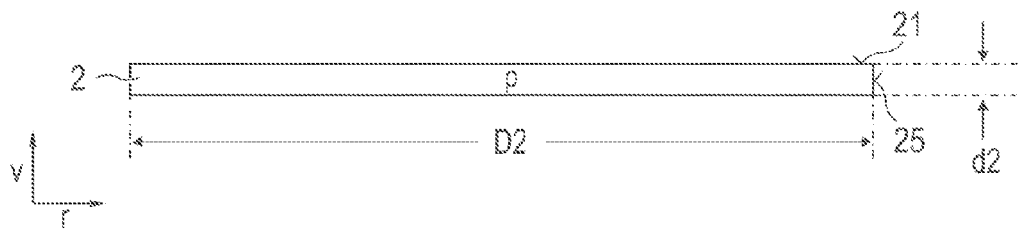
FIGS. 1A-1C are cross-sectional views of different steps of the production of an n-doped semiconductor zone on a carrier.

Referring now to FIG. 1A there is illustrated a carrier 2 which may be, for instance, a flat semiconductor substrate. In a lateral direction r, the carrier 2 has a width D2 and, in a vertical direction v which is perpendicular to the lateral direction r, a thickness d2. The width D2 may be, for instance, at least 200 mm, at least 300 mm or at least 450 mm. The thickness d2 may, for instance, range from 0.4 mm to 1 mm with 0.725 mm or 0.775 mm or 0.925 mm as typical values. Absent from possible deviations at the lateral edges 25, the thickness d2 may be uniform over the whole substrate 2. The carrier 2 may be a doped or undoped semiconductor material, for instance, silicon, germanium, silicon carbide (e.g. 3C—SiC, 4H—SiC or 6H—SiC), GaAs, InP, GaN, or ternary or quaternary compound semiconductor. For instance, a commercially available conventional wafer, e.g. having a width and, accordingly, a diameter D2 of about 300 mm, may be used as the carrier 2. Optionally, the carrier 2 may consist of or comprise a semiconductor material which is doped, for instance p-doped. As dopant, e.g. Boron (B) may be used as Boron doped wafers are commercially available. However, any other doped or undoped semiconductor material may be used as well. Hence, the carrier 2 may consist of or comprise a p-doped semiconductor zone.

Figure 1B:
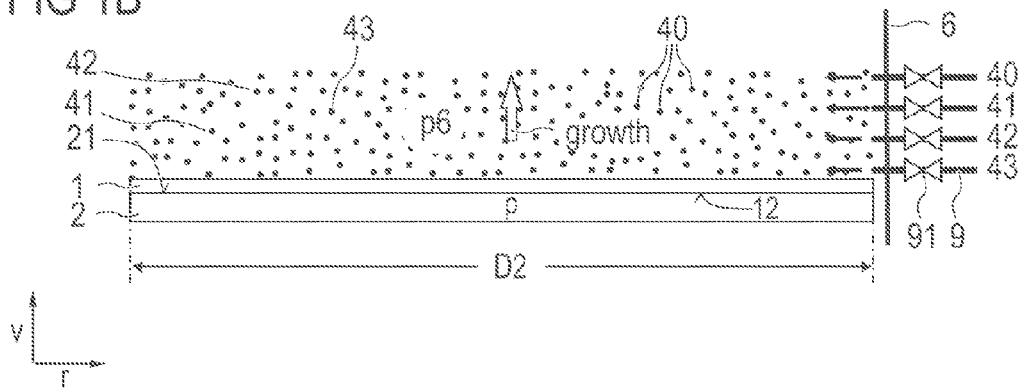
Figure 1C:
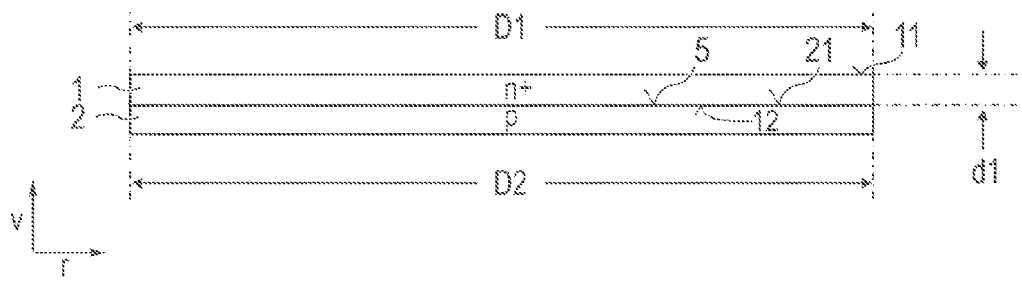

As illustrated in FIGS. 1B and 1C, a heavily n-doped and—in the ideal case monocrystalline—semiconductor zone 1 may be epitaxially grown on a top side 21 of the carrier 2. The top side 21 is, except of possible deviations at the lateral edges 25 of the substrate 2, substantially planar so as to allow for the growth of the heavily n-doped semiconductor zone 1. In order to achieve a crystalline semiconductor zone with a very low electric resistance having a good quality, that is, with no or only view crystallographic defects, it is advantageous if the crystalline structure of the heavily n-doped semiconductor zone 1 to be produced is identical or similar to the crystalline structure of the carrier 2. To this, both the substrate 2 and the semiconductor zone 1 to be produced may have—except for the respective doping—the same semiconductor basis material. As can be seen from FIG. 1C, the completed semiconductor zone 1 has, in the vertical direction v, a thickness d1 which may be, for instance, in the range from 50 µm to 200 µm, or in the range from 60 µm to 180 µm. Perpendicular to the vertical direction v, the completed semiconductor zone 1 has a width D1 which may be, for instance, at least 200 mm, at least 250 mm, or at least 300 mm or at least 450 mm. D1 may substantially be identical with D2.

The epitaxial growth of the heavily n-doped semiconductor zone 1 may take place in a processing chamber 6, e.g. a fused silica processing chamber, using a vapor deposition method, e.g., a CVD method (CVD=chemical vapor deposition), in which method the carrier 2 is placed in the processing chamber 6 and exposed to one or more volatile precursors/dopants 40, 41, 42, 43 at a total gas pressure p6. In addition, molecular hydrogen 45 (H2) may also be part of the gas in the processing chamber. In FIG. 1B, the processing chamber 6 is indicated only schematically. A precursor reacts and/or decomposes inter alia at the top side 21 of the carrier 2, thereby forming the heavily n-doped semiconductor zone 1. At least one semiconductor material precursor 40 serves to provide the constituents of the (undoped) semiconductor material itself. For instance, if the heavily n-doped semiconductor zone 1 to be produced is a silicon semiconductor zone, the first precursor 41 may be, e.g., silane (SiH4), dichlorosilane (SiH2Cl2), trichlorosilane (SiHCl3) or silicon tetrachloride (SiCl4).

The n-doping of the heavily n-doped semiconductor zone 1 to be produced may be achieved by using two dopants, for instance arsenic (As) as a first dopant and phosphorus (P) as a second dopant. To provide the arsenic (As), arsine (AsH3) may be used as a first dopant precursor 41 in the CVD process. Then, to provide the phosphorus (P), phosphine (PH3) may be used as a second dopant precursor 42.

Generally, if a low specific resistance of the semiconductor zone 1 is desired, for instance in order to achieve a semiconductor component having a low on-resistance $R_{ON}$, phosphorus (P) is preferred over arsenic (As) or antimony (Sb) as, in a silicon-based, heavily n-doped semiconductor zone 1, a desirably low specific resistance of about 1 mΩ·cm can be achieved, compared with about 2 mΩ·cm in the case of arsenic (As). However, a large amount of phosphorus (P) would result in a change of the effective lattice constant in zone 1 and therefore in an increased stress of the mechanical system comprised of carrier 2 and semiconductor zone 1. The stress will lead inevitably to either a bending of the unit formed of the carrier 2 and the semiconductor zone 1 such that the completed semiconductor zone 1 has a bow or, at even higher stress levels, to a mechanical relaxation. The relaxation may reduce the bow to a certain extent, however this will lead in any case to slip of certain crystallographic lattice planes which are accompanied with lattice dislocations possibly leading to electrical failures of devices built within the affected crystal volume.

Such changes of the lattice constant of the semiconductor crystal depend on dopants comprised therein. For example, if the concentration of phosphorus exceeds $5 \cdot 10^{19}$ cm$^{-3}$, in typical Czochralski grown silicon the relative lattice mismatch exceeds $5 \cdot 10^{-5}$ which may lead already to slip occurrence for epitaxial thicknesses greater 10 µm for the semiconductor zone 1. The center wafer bow would be of the order of 20 µm or 45 µm for substrate diameters of 200 mm or 300 mm, respectively. This bow can still be handled by typical lithography tools. If the center bow of the semiconductor zone 1 exceeds about 70 µm, the lithographic processes subsequent to the production of the heavily n-doped semiconductor zone 1 are essentially uncontrollable. This limit corresponds to a doping of the semiconductor zone 1 with phosphorus leading to 0.8 mOhm·cm and 20 µm thickness at 200 mm substrate diameter. In case of higher values of substrate diameters the situation gets even worse, e.g. already at 1.5 mOhm·cm for a substrate diameter of 300 mm.

Hence, one optional measure for achieving an optimum low specific resistance is to use arsenic (As) as a first dopant and to keep the amount of phosphorus (P) as high as possible subject to the restriction that the subsequent processability is guaranteed. Both arsenic (As) and phosphorus (P) are n-dopants in silicon or in silicon carbide and therefore serve to provide for a heavily n-doped semiconductor zone 1. However, arsenic (As) counteracts the lattice constant amending effect of phosphorus (P). Generally, the same principle will apply to reduce the bow forming effect of any other n-dopant by additionally doping the semiconductor zone 1 with a co-dopant that counteracts the lattice constant amending effect of the other dopant. The co-dopant may also preferably be an n-dopant, or, alternatively, an "electrically inactive" dopant which in the sense of the present invention designates a dopant that acts neither n-doping nor p-doping in the semiconductor material of the semiconductor zone 1 to be produced. For pure n-doping purposes, phosphorus (P) doping can be combined with arsenic (As) or antimony (Sb) or a combination of both to shift the net lattice distance closer to the substrate 2 lattice distance. If dopants that act as n-dopants in silicon (Si) like arsenic (As), antimony (Sb) or a combination of both, the lattice constant enlarging effect caused by these n-dopants can also be compensated by additionally doping the silicon (Si) with one or more electrically inactive elements like C (carbon) that have a smaller atomic radius compared to silicon (Si). Another possibility is to use phosphorus (P) as n-dopant in silicon (Si) and to compensate the lattice constant reducing effect caused by phosphorus (P) by additionally doping the silicon (Si) with one or more electrically inactive dopants like germanium (Ge) or tin (Sn), both having a greater atomic radius compared to silicon (Si), or a combination of both. In case for a pure p-type doping of the semiconductor zone 1 with doping element boron (B) the analogue possibilities are a combination of one or more of the active elements aluminium (Al) or gallium (Ga) or indium (In) (all three with greater atomic radii compared to silicon (Si)) or a combination of these elements. Also Ge or Sn or a combination of both can be used as electrically inactive doping elements to compensate for the smaller atomic size of B dopant compared to Si.

The following table gives an overview over the doping effect of certain electrically active and inactive dopants in a silicon base material:

| dopant | | covalent atomic radius ($10^{-12}$ m) | doping effect in silicon | | |
|---|---|---|---|---|---|
| | | | n-doping | p-doping | electrically inactive |
| C | carbon | 77 | | | x |
| B | boron | 82 | | x | |
| P | phosphorus | 106 | x | | |
| Si | silicon | 111 | | | x |
| Al | aluminum | 118 | | x | |
| As | arsenic | 119 | x | | |
| Ge | germanium | 122 | | | x |
| Ga | gallium | 126 | | x | |
| Sb | antimoni | 138 | x | | |
| Sn | tin | 141 | | | x |
| In | indium | 144 | | x | |

The entries in the table are sorted with ascending covalent atomic radius. The dopants with a covalent atomic radius smaller than the covalent atomic radius of silicon (Si), that is, C, B and P, cause a reduction of the lattice constant of a silicon semiconductor crystal. Accordingly, the dopants with a covalent atomic radius greater than the covalent atomic radius of silicon (Si), that is, Al, As, Ge, Ga, Sb, Sn and In, cause an increase of the lattice constant of a silicon-based semiconductor crystal.

Hence, if an n-doped silicon-based semiconductor zone 1 is to be produced, phosphorus (P) may be used. In order to compensate the lattice constant reducing effect of phosphorus (P), the semiconductor zone 1 can be additionally doped with one or an arbitrary combination of Al, As, Ge, Ga, Sb, Sn and In. As arsenic (As) and antimony (Sb) are also n-dopants, a combination of phosphorus (P) and one or both of arsenic (As) and antimony (Sb) leads to an effectively n-doped semiconductor zone 1. Also possible to compensate the lattice constant reducing effect of phosphorus (P) is to additionally dope the semiconductor zone 1 with one or both of the electrically inactive dopants germanium (Ge) and tin (Sn). However, the p-dopants aluminum (Al), gallium (Ga) and indium (In) would counteract the desired n-doping and therefore are second-best options only. Of course, a compensation of the lattice constant reducing effect of phosphorus (P) can also be achieved by additionally doping the first semiconductor zone 1 as well with one or both of the electrically active n-dopants arsenic (As) and antimony (Sb) as with one or both of the electrically inactive dopants germanium (Ge) and tin (Sn).

The same principle may apply if an n-doped silicon-based semiconductor zone 1 is to be produced with one or both of arsenic (As) and antimony (Sb) as active n-dopants. In order to compensate the lattice constant increasing effect of arsenic (As) and/or antimony (Sb), the semiconductor zone 1 can be additionally doped with one or an arbitrary combination of carbon (C), boron (B) and phosphorus (P). As phosphorus (P) is also a n-dopant, a combination of one or both of arsenic (As) and antimony (Sb) and phosphorus (P) leads to an effectively n-doped semiconductor zone 1 (of course with the same result as above when starting with phosphorus (P) as n-dopant). Also possible to compensate the lattice constant increasing effect of one or both of arsenic (As) and antimony (Sb) is to additionally dope the semiconductor zone 1 with the electrically inactive dopant carbon (C). However, the p-dopant boron (B) would counteract the desired n-doping and therefore is a second-best option only. Of course, a compensation of the lattice constant increasing effect of one or both n-dopants arsenic (As) and antimony (Sb), can also be achieved by additionally doping the first semiconductor zone 1 as well with the electrically active n-dopant phosphorus (P) as with the electrically inactive dopant carbon (C).

Hence, a n-doped semiconductor zone 1 of a silicon based semiconductor body may comprise in particular the following combinations of dopants:

P with As.
P with As and Sb.
As with Sb.
P with As and with one or an arbitrary combination of C, Ge, Sn.
P with As, Sb and with one or an arbitrary combination of C, Ge, Sn.
As with Sb and with one or an arbitrary combination of C, Ge, Sn.
P with one or an arbitrary combination of C, Ge, Sn.
As with one or an arbitrary combination of C, Ge, Sn.
Sb with one or an arbitrary combination of C, Ge, Sn.
Thereby, one or an arbitrary combination of C, Ge and Sn is: C. Ge. Sn. C with Ge. C with Sn. Ge with Sn.

Further, if a p-doped silicon-based semiconductor zone 1 is to be produced, boron (B) may be used. In order to compensate the lattice constant reducing effect of boron (B), the semiconductor zone 1 can be additionally doped with one or an arbitrary combination of Al, As, Ge, Ga, Sb, Sn and In. As aluminum (Al), gallium (Ga) and indium (In) are also p-dopants, a combination of boron (B) and one or an arbitrary combination of aluminum (Al), gallium (Ga) and indium (In) leads to an effectively p-doped semiconductor zone 1. Also possible to compensate the lattice constant reducing effect of boron (B) is to additionally dope the semiconductor zone 1 with one or both of the electrically inactive dopants germanium (Ge) and tin (Sn). However, the n-dopants arsenic (As) and antimony (Sb) would counteract the desired p-doping and therefore are second-best options only. Of course, a compensation of the lattice constant reducing effect of boron (B) can also be achieved by additionally doping the first semiconductor zone 1 as well with one or an arbitrary combination of the electrically active p-dopants aluminum (Al), gallium (Ga) and indium (In) as with one or both of the electrically inactive dopants germanium (Ge) and tin (Sn).

A p-doped silicon-based semiconductor zone 1 may also be produced with one or an arbitrary combination of aluminum (Al), gallium (Ga) and indium (In) as active p-dopants. In order to compensate the lattice constant increasing effect thereof, the semiconductor zone 1 can be additionally doped with boron (B). As boron (B) is also a p-dopant, a combination of one or an arbitrary combination of aluminum (Al), gallium (Ga) and indium (In) with boron (B) leads to an effectively p-doped semiconductor zone 1 (of course with the same result as above when starting with boron (B) as p-dopant). Also possible to compensate the lattice constant increasing effect of one or an arbitrary combination of aluminum (Al), gallium (Ga) and indium (In) is to additionally dope the semiconductor zone 1 with the electrically inactive dopant carbon (C). However, the n-dopant phosphorus (P) would counteract the desired p-doping and therefore is second-best option only. Of course, a compensation of the lattice constant increasing effect of one or an arbitrary combination of aluminum (Al), gallium (Ga) and indium (In) can also be achieved by additionally doping the first semiconductor zone 1 as well with the electrically active p-dopant boron (B) as with the electrically inactive dopant carbon (C).

Hence, a p-doped semiconductor zone 1 of a silicon based semiconductor body may comprise in particular the following combinations of dopants:

B with one or an arbitrary combination of Al, Ga, In.
B with one or both of Ge, Sn.
B with one or an arbitrary combination of Al, Ga, In, and with one or both of Ge, Sn.
An arbitrary combination of Al, Ga, In with C.
Thereby, one or an arbitrary combination of Al, Ga, In: Al. Ga. In. Al with Ga. Al with In. Ga with In.

An optional measure for improving the wafer bow problem is to dope the semiconductor zone 1 to be produced with a hardening dopant that increases the hardness of the heavily n-doped semiconductor zone 1. To this, the hardening dopant or a precursor 43 of the hardening dopant may be used in the vapor deposition process. Due to the hardening, the bendability and, coming along therewith, the center bow— compared with the center bow of an unhardened but otherwise identical—semiconductor zone 1 are reduced.

Alternatively or in addition to introducing the hardening dopants 43 into the n-doped semiconductor zone 1 in the vapor deposition process, in which the n-doped semiconductor zone 1 is grown, the hardening dopants 43 may also be introduced by a diffusion process. According to one example, the hardening dopants 43 may be comprised in the carrier 2 and subsequently be diffused into an epitaxial layer 3 via its bottom side 32 during and/or after the epitaxial layer 3 is grown. Alternatively or in addition, the hardening dopants 43 may be introduced into the completed epitaxial layer 3 via its top side 31.

Suitable hardening dopants 43 are, for instance, nitrogen (N) or oxygen (O). One or, in any combination, more different types of hardening dopants may be used as (electrically inactive) hardening dopants of the semiconductor zone 1. The hardening dopants 43 may be used as dopants for hardening any n-doped or p-doped semiconductor zone 1. To this, any semiconductor zone 1 may be doped in addition to the above-mentioned electrically active and/or electrically inactive dopants with one or an arbitrary combination of hardening dopants 43 like nitrogen (N) and oxygen (O).

To provide nitrogen (N) doping of the semiconductor layer, a nitrogen-containing precursor 43 e.g. molecular nitrogen (N2) and/or ammonia (NH3) may be used in the CVD process. Alternatively or in addition, other nitrogen containing molecules may also be used. For instance, for molecular nitrogen (N2) in trichlorosilane (SiHCl3) at a gas temperature of about 1180° C., at an atmospheric gas pressure p6 and at a partial pressure of molecular nitrogen (N2) of 1.5 hPa, for the formation of the n-doped semiconductor zone 1, a deposition rate of 3 µm/minute could be achieved.

Then, to provide the oxygen (O) doping, an oxygen-containing precursor 43, nitrous oxide (N2O) or nitrogen dioxide (NO2) may be used. With both nitrous oxide (N2O) or nitrogen dioxide (NO2), the semiconductor zone 1 is, in addition to oxygen, also doped with nitrogen (N).

In case the hardening dopants 43 comprise nitrogen (N), the average concentration of nitrogen (N) may range from e.g. $2 \cdot 10^{14}$ to $5 \cdot 10^{15}$ nitrogen atoms/cm$^3$, or from $5 \cdot 10^{14}$ to $2 \cdot 10^{15}$ nitrogen atoms/cm$^3$.

In addition to the hardening effect, electrically inactive dopants 43, e.g. nitrogen (N), may be used to indirectly adjust the electrical behaviour of the semiconductor component as they affect the charge carrier lifetime. This effect may be used, for instance, in structures for ESD (electrostatic discharge) protection to reduce the variation of the break down voltages.

Alternatively or in addition to the measures mentioned above, germanium (Ge) may be introduced into the semiconductor zone 1 during its production, for instance in the mentioned vapor deposition process, or after the semiconductor zone 1 is completed, in order to avoid crystal defects by appropriately adjusting the crystallographic lattice constant of the semiconductor zone 1.

During the vapor deposition process, the dopants/precursors 40, 41, 42, 43 may be individually fed into the processing chamber 6 via gas supply lines 9. Using controllable valves 91 inserted in the gas supply lines 9 allow for controlling the composition of the gas mixture in the processing chamber time-dependent, and, accordingly, for the run of the concentration the respective dopant has in the completed heavily n-doped semiconductor zone 1 in the vertical direction v.

In the vertical direction of the completed heavily n-doped semiconductor zone 1, each of the individual dopants may have a certain concentration gradient which may be adjusted during the vapor deposition process by amending the concentration of the respective dopant or precursor in the gas. In the example of phosphorus (P) as a dopant, starting from the bottom side 12 of the heavily n-doped semiconductor zone 1 away from the carrier 2 in the vertical direction v, the concentration of phosphorus (P) in the completed heavily n-doped semiconductor zone 1 may gradually decrease towards the top side 11 of the heavily n-doped semiconductor zone 1 or alternatively firstly may gradually increase and then decrease towards the top side 11 of the heavily n-doped semiconductor zone 1. Alternatively, the dopant concentration of the heavily n-doped semiconductor zone 1 may be nearly constant between starting from the bottom side 12 of heavily n-doped semiconductor zone 1 the as far as about 40% to 80% of the thickness of the heavily n-doped semiconductor zone 1 and may then gradually decrease towards the top side 11 of the heavily n-doped semiconductor zone 1 for the remaining thickness of zone 1. The decrease may be e.g. from 100% at the bottom side 12 of heavily n-doped semiconductor zone 1 to about 50%, 30% or 10% at the top side 11 of the heavily n-doped semiconductor zone 1. Such a doping gradient can be very helpful for a further reduction of stress and for a defect-free growth of further semiconductor layers on the heavily n-doped layer 11.

After the heavily n-doped semiconductor zone 1 is completed as illustrated in FIG. 1C, the arrangement comprising the carrier 2 and the heavily n-doped semiconductor zone 1 thereon may be used to produce one or more semiconductor components in which the heavily n-doped semiconductor zone 1 entirely or at least partly forms a residual part of the completed semiconductor component(s). An example for such further processing will now be explained with reference to FIGS. 2A to 2D.

Figure 2A:
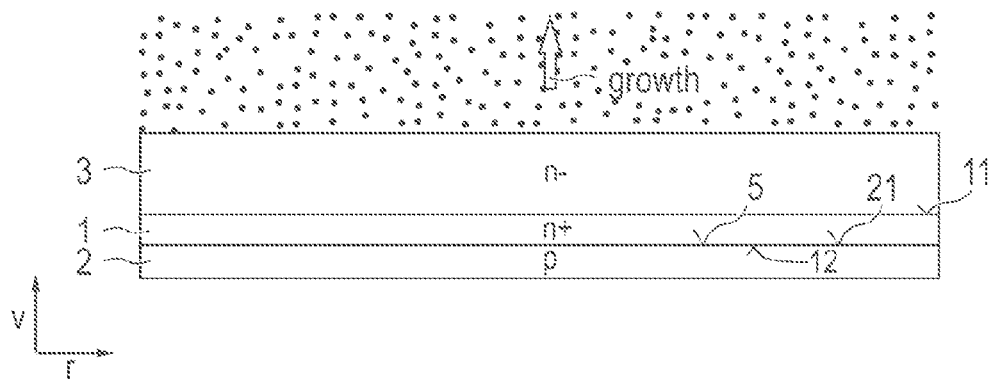
FIGS. 2A-2D are cross-sectional views of different steps of the production of a semiconductor device starting from the arrangement shown of FIG. 1C.

As illustrated in FIG. 2A, a further epitaxial layer 3 is grown on the top side 11 of the heavily n-doped semiconductor zone 1, that is, on that side of the heavily n-doped semiconductor zone 1 facing away from the carrier 2. If in the embodiment of FIG. 2A the epitaxial layer 3 is completed, it is low or medium n-doped and may have, optionally, a lower average concentration of n-dopants than the heavily n-doped semiconductor zone 1. However, in other embodiments, in particular if the semiconductor zone 1 is p-doped, the epitaxial layer 3 may alternatively be p-doped. Even though there is no processing chamber illustrated in FIG. 2A, growing the epitaxial layer 3 may take place in the same processing chamber 6 already described with reference to FIG. 1B, or in a different processing chamber.

The parameters for growing the epitaxial layer 3, that is, inter alia, the mixture of gas from which the epitaxial layer 3 is grown, need to be adjusted in such a manner that the lattice mismatch between the crystal lattice of the carrier 2 and the crystal lattice of the epitaxial layer 3 is low in order to avoid crystallographic defects like line defects. Optionally, the epitaxial layer 3 may at least partially also have a doping gradient with e.g. a doping level decreasing from interface 11.

As will be explained later with reference to FIGS. 9A and 9B, optional columns may be formed in the further epitaxial layer 3, to realize a compensation structure. The type of conductivity of the columns is contrary to the type of conductivity of the further epitaxial layer 3.

Figure 2B:
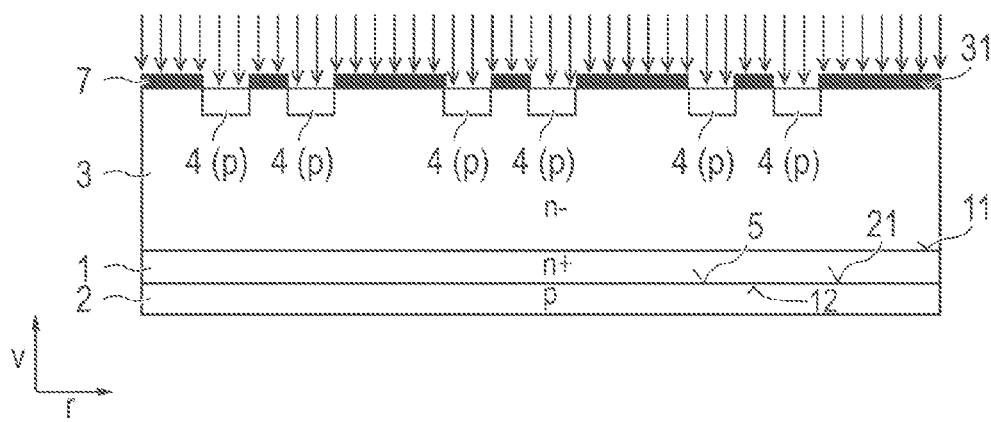

After the epitaxial layer 3 is completed, the arrangement may be further processed depending on the requirements of the semiconductor component(s) to be produced. To this, a number of different steps like forming and structuring masks, implanting and/or diffusing n- and/or p-dopants into the epitaxial layer 3, forming and structuring dielectric layers, metallizations etc. may be executed. In order to exemplify such additional steps, in FIG. 2B a mask 7 is formed and structured on the top side 31 of the completed epitaxial layer 3, that is, on that side facing away from the heavily n-doped semiconductor zone 1. The mask 7 serves to produce p-doped body zones 4 of a number of n-channel drain down power transistors by, for instance, implanting p-dopants through openings of the mask 7 into the epitaxial layer 3. In FIG. 2B, the p-dopants are indicated by arrows.

Each of the transistors includes a number of transistor cells each cell having at least one p-doped body zone 4. In this regard it is to be noted that for the sake of presentability only view p-doped zones 4 are shown in FIG. 2B. In contrast, a real transistor may have a significantly larger number of such transistor cells formed in a common semiconductor body and electrically connected in parallel so as to form a unitary transistor in which all of the transistor cells connected in parallel have a common source contact, a common drain contact and a common gate contact and can be controlled via the common gate contact in the same manner.

Figure 2C:
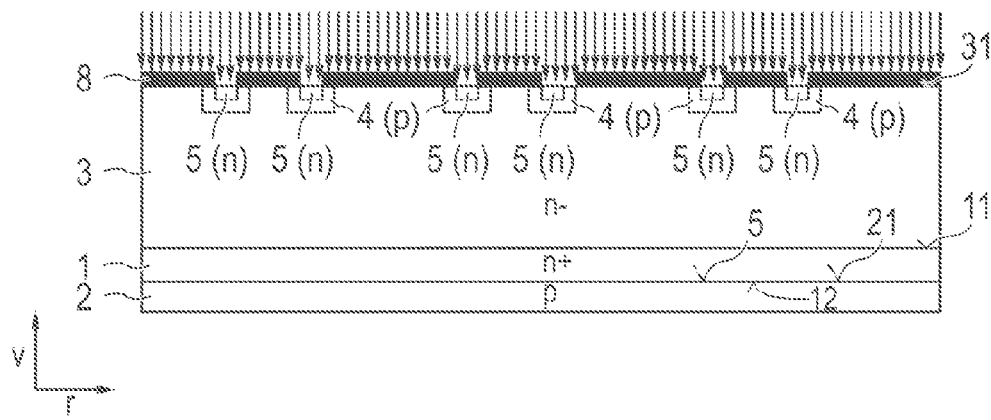

Analogously, in one or more further masked doping steps, n- and/or p-doping dopants may be introduced into the epitaxial layer 3. This is illustrated by way of example with reference to FIG. 2C where a further mask 8 is formed and structured on the top side 31 of the epitaxial layer 3. The mask 8 serves to produce heavily n-doped source zones 5 inside the p-doped body zones 4 by, for instance, implanting n-dopants through openings of the mask 8 into the epitaxial layer 3. In FIG. 2C, the n-dopants are indicated by arrows.

Figure 2D:
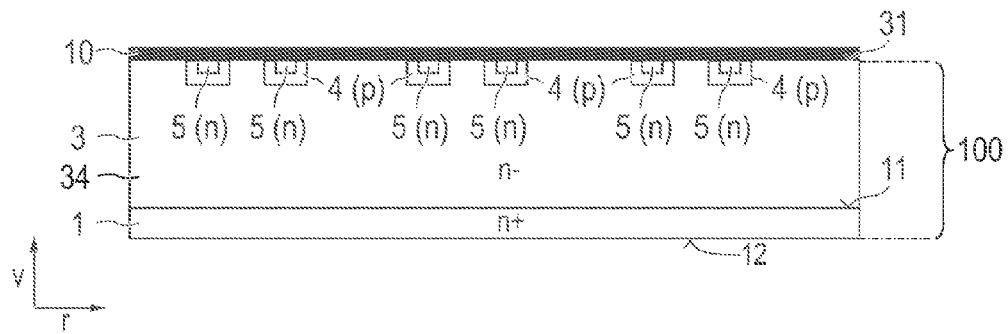

After the completion of the epitaxy process for producing the epitaxial layer 3 and, optionally, after one or more subsequent process steps, the carrier 2 may be removed such that a bottom side 12 of the heavily n-doped semiconductor zone 1 forms a bottom side of the arrangement. For the removal of the carrier 2, etching, lapping or polishing may be used, either alone or in arbitrary combinations. In order to not adversely affect other parts of the arrangement, such parts may be protected by a protective coating 10 as exemplary illustrated in FIG. 2D. The coating 10 may not only cover the top side or parts of the top side of the produced semiconductor body 100 but also its side walls or parts of its side walls. In order to assure a complete removal of the carrier 2, also a bottom part of the heavily n-doped semiconductor zone 1 may be removed. FIG. 2C shows the arrangement with the protective coating 10 applied. In FIG. 2D, the carrier 2 is completely removed. The completed device comprises a weakly n-doped drift zone 34 which is formed from the epitaxial layer 3.

In case of a p-doped carrier 2, a pn-junction 5 is formed between the heavily n-doped semiconductor zone 1 and the p-doped carrier 2. Hence, the p-doped carrier may be removed by electrochemical wet etching (ECE), that is, a selective etching method in which selectively only the p-doped carrier 2 is removed. This allows a relatively exact thickness adjustment.

As it is evident from FIG. 2D, the heavily n-doped semiconductor zone 1 may be a drain zone of an arbitrary drain down transistor.

Figure 3A:
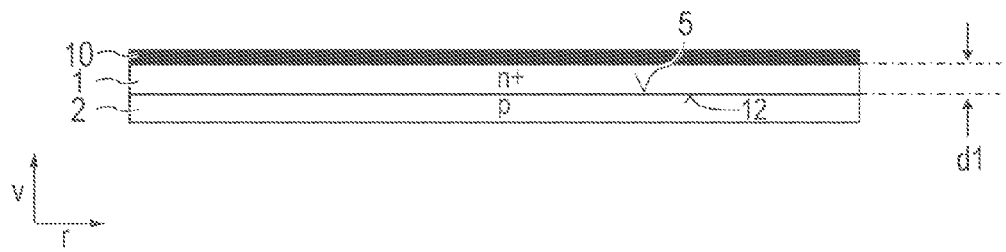
FIGS. 3A-3C are cross-sectional views of different steps of the production of a large-area n-doped substrate.
Figure 3B:
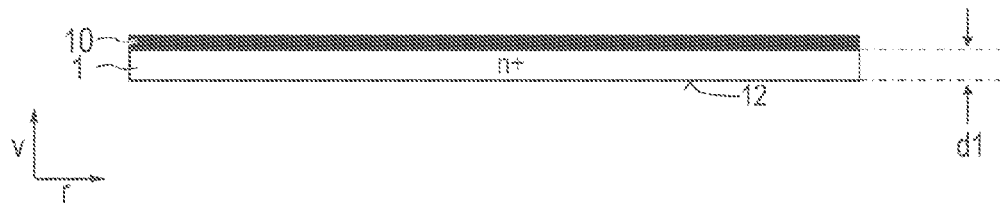
Figure 3C:
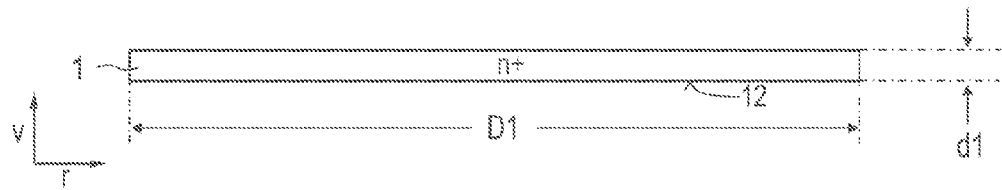

Instead of forming one or more semiconductor components or pre-stages of one or more semiconductor components from the arrangement shown in FIG. 1C, the carrier 2 shown in FIG. 1C may be removed in order to provide a semiconductor substrate that only consists of the first semiconductor zone 1. To this, the carrier 2 may be removed by the techniques already described with reference to FIGS. 2C and 2D. FIG. 3A shows the arrangement of FIG. 1C provided with a protective coating 10 which has the same function as described with reference to the protective coating 10 of FIG. 2D. In FIG. 3B, the carrier 2 shown in FIG. 3A is removed by etching, lapping or polishing or a combination thereof. Then, the protective layer 10 is removed in order to provide a heavily n-doped semiconductor substrate 1 as illustrated in FIG. 3C. The substrate 1 may have a large width and/or diameter D1 of, for instance, at least 200 mm, at least 250 mm or at least 300 mm. However, the described method may also be used for the production of n-doped substrates having a width/diameter of less than 200 mm.

Generally, an-doped substrate 1 that only consists of a n-doped semiconductor zone 1 may be used for the production of arbitrary semiconductor components as, for instance, described with reference to FIGS. 2A to 2C with the sole difference that the carrier 2 is already removed.

Optionally, the bottom side 12 of the heavily n-doped semiconductor zone 1 may be provided with a metal layer, for instance a drain metallization of the semiconductor component to be produced. To this, a very low specific resistance of the heavily n-doped semiconductor zone 1 in particular at its bottom side 12 is desirable. A low specific resistance can be achieved with a high dopant concentration of the heavily n-doped semiconductor zone 1. In order to avoid the necessity of additional steps for increasing the dopant concentration it is desirable that the required final dopant concentration is adjusted during the epitaxial growth of the heavily n-doped semiconductor zone 1 illustrated in FIG. 1B.

On the other hand, a high n-dopant concentration of the semiconductor zone 1 causes a diffusion of the n-dopants into a further epitaxial layer 3 that is grown on such a heavily n-doped semiconductor zone 1. As phosphorus (P) has a diffusion coefficient higher than arsenic (As) and antimony (Sb), phosphorus (P) would diffuse comparatively far into the further epitaxial layer 3, thereby creating a "diffusion tail" in the further epitaxial layer 3. Such a diffusion tail however reduces the on-resistance $R_{ON}$ and the breakdown voltage of the component to be produced. Hence, if a predetermined n-dopant concentration of the heavily n-doped semiconductor zone 1 is to be achieved, the heavily n-doped semiconductor zone 1 may be doped partly with an n-dopant that has a diffusion coefficient which is lower than the diffusion coefficient of phosphorus (P).

Figure 4:
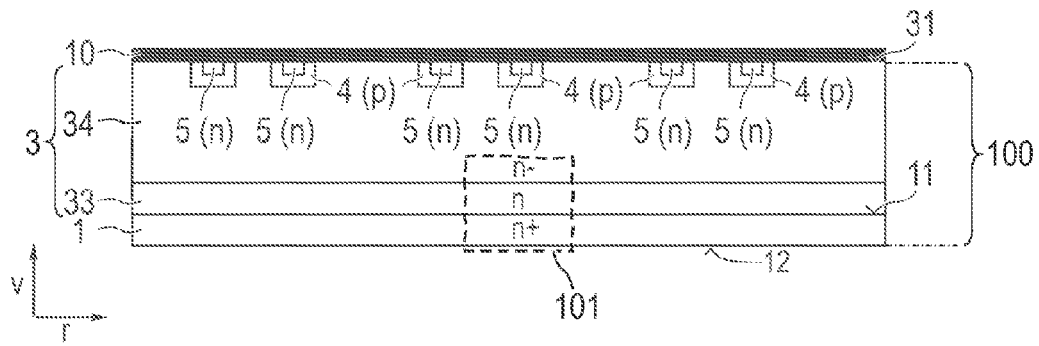
FIG. 4 illustrates a semiconductor arrangement that additionally includes, compared to the arrangement of FIG. 2D, a field stop zone.

However, it may be desired for some drain down components to have an n-doped field stop zone that is produced in the epitaxial layer 3 and that extends, in the vertical direction v, from the bottom side 32 of the epitaxial layer 3 into the epitaxial layer 3. FIG. 4 shows such an arrangement which differs from the arrangement of FIG. 2D only in the additional n-doped field stop zone 33. In order to provide such an n-doped field stop zone 33, the formation of a diffusion tail of phosphorus (P) into the epitaxial layer 3 may be used in combination with a high temperature process subsequent to the production of the epitaxial layer 3. To this, the concentration of phosphorus (P) and the gradient the concentration of phosphorus (P) has in the vertical direction v may be adjusted such that in the subsequent high temperature process, the field stop zone 33 with the desired field stop doping profile is formed from the diffusion tails of phosphorus (P) and of the other n-dopants included in the heavily n-doped semiconductor zone 1.

Figure 5:
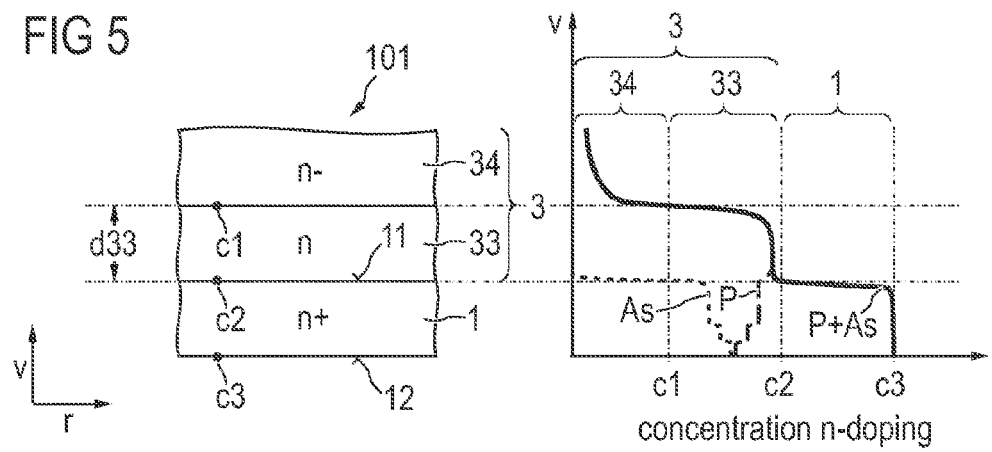
FIG. 5 illustrates the course of the n-dopant concentration of an enlarged section of the semiconductor arrangement of FIG. 4 according to one embodiment.

For an enlarged section 101 of the semiconductor body 100 of the device, FIG. 5 illustrates the course of the n-dopant concentration, that is, the concentration of all atoms that have an n-doping effect in the semiconductor base material of the semiconductor body 100. In that embodiment, the concentrations of the electrically active dopants P (broken line) and As (dotted line) sum up to the n-dopant concentration (continuous line). At the bottom side 12 of the heavily n-doped semiconductor zone 1, the n-dopant concentration (continuous line) starts with a concentration c3 and monotonically decreases in the vertical direction v within the semiconductor zone 1 to a concentration c2 at the boundary to the n-doped field stop zone 33. Within the thickness d33 of the n-doped field stop zone 33, the n-dopant concentration further decreases in the vertical direction v to a concentration c1 at the boundary to the weakly n-doped drift zone 34. Thereby, starting from the bottom side 12, the phosphorus (P) concentration gradually increases in the vertical direction v in order to avoid crystal dislocations in a state in which the p-doped carrier 2 has not yet been removed from the semiconductor zone 1.

Figure 6:
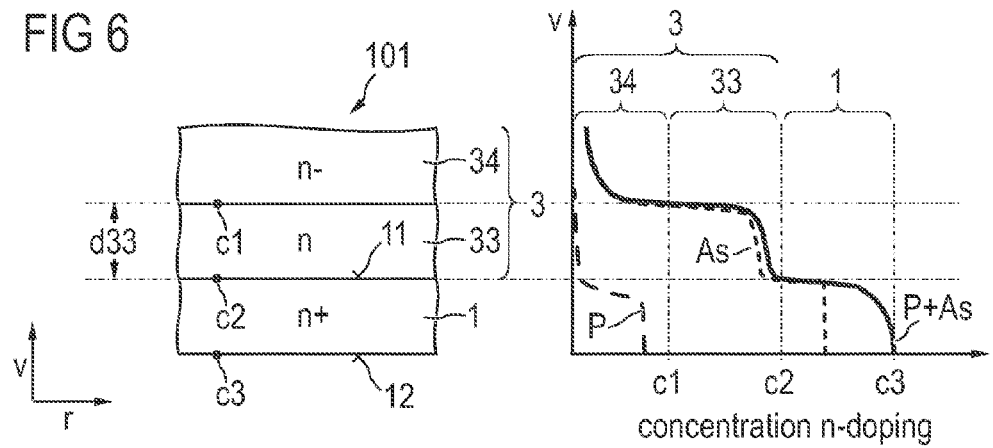
FIG. 6 illustrates the course of the n-dopant concentration of an enlarged section of the semiconductor arrangement of FIG. 4 according to another embodiment.

According to a further embodiment illustrated in FIG. 6, starting from the bottom side 12 in the vertical direction v, the phosphorus (P) concentration is reduced towards the top side 11 so that the diffusion tail of the phosphorus (P) concentration lies within the diffusion tail of the arsenic (As) concentration.

Choosing the doping levels of phosphorus (P) and arsenic (As) so that they are very similar, a two-step field stop profile can be realized which can be very helpful e.g. for the avalanche robustness and ruggedness against cosmic radiation.

The thickness d33 of the field stop zone may range, for instance, from 3 μm to 20 μm, or from 5 μm to 10 μm. However, thicknesses below 3 μm or above 20 μm may also be used if desired. The concentration c2 at the boundary between the field stop zone 33 and the n-doped semiconductor zone 1 may range, for instance, from some $10^{18}$ cm$^{-3}$ to $10^{19}$ cm$^{-3}$. Regardless of the above mentioned values for the thickness d33 and the concentration c2, the concentration c1 may range from 0.1·c2 to 0.5·c2. The values and relationships for the concentrations c1, c2, c3 and the thickness d33 mentioned above may apply to any n-dopant(s) that have an n-doping effect in the semiconductor base material of the semiconductor body 100.

In the example of FIG. 5 which relates to silicon as the base material of the semiconductor body 100, the n-dopant concentration (continuous line) is the sum of the concentrations of phosphorus (P; broken line) and arsenic (As; dotted line). Within the first semiconductor zone 1, the concentration of arsenic (As) monotonically decreases in the vertical direction v. Within the adjacent field stop zone 33, the concentration of arsenic (As) further decreases monotonically in the vertical direction v and rapidly drops, with a short diffusion tail, to zero within the transition region between the field stop zone 33 and the adjacent drift zone 34. As soon as the concentration of arsenic (As) is zero, the n-dopant concentration (continuous line) is a result of the phosphorus (P) concentration only.

With the method and variations mentioned above it is possible to produce a heavily n-doped semiconductor zone 1 having a specific resistance of less than or equal to 1.5 mΩ·cm. In case of arsenic (As) as an n-dopant, a specific resistance in that range has been achieved by using a 10% dilution of precursor AsH3 diluted in molecular hydrogen (H2), that is, the volumetric ratio of AsH3 molecules to hydrogen molecules is 1:10, during the vapor deposition process for producing the heavily n-doped semiconductor zone 1.

Summarized, an n-doped semiconductor zone 1 may be produced on a carrier 2 as described above. Subsequently, the carrier 2 may be removed at any arbitrary stage of further treatment. Hence, the heavily n-doped semiconductor zone 1 may solely be a semiconductor substrate that consists of the heavily n-doped semiconductor zone 1, or a part of a semiconductor arrangement or a semiconductor component having additional elements like p-doped semiconductor zones etc. as, for instance, the mentioned source down transistors (MOSFETs, IGBTs, CoolMos devices or other compensation-based devices etc.). In principle however, any arbitrary semiconductor component requiring a heavily n-doped semiconductor zone may be built on the basis of a heavily n-doped semiconductor zone 1 that has been produced with a method as described above.

The doping level in semiconductor zone 1 depends on the electrical function of this layer. For example, in an application for low voltage devices a typical lower limit of the n-type doping is around 5·$10^{19}$ cm$^{-3}$. In case the semiconductor zone 1 will at least partly contribute to the Ron-resistance of a device to be produced, the doping level should be as high as possible which will also improve the ohmic transition from semiconductor to backside metallization.

Figure 7:
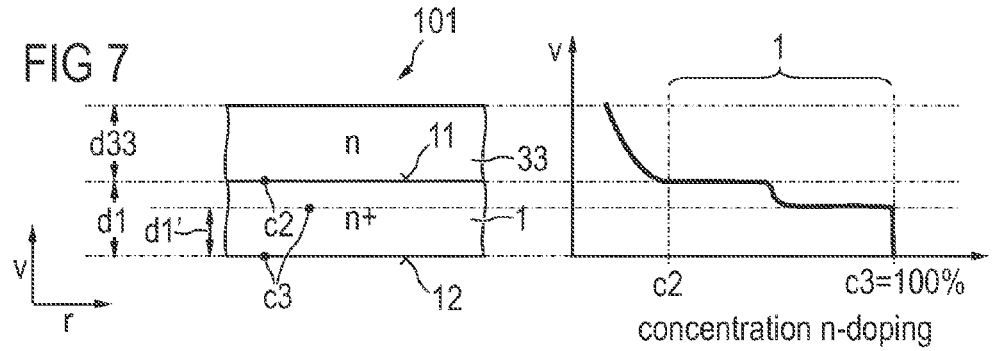
FIG. 7 illustrates a further embodiment of the course of the n-dopant concentration of an enlarged section of the semiconductor arrangement of FIG. 4.

According to a further embodiment illustrated in FIG. 7, the dopant concentration of the heavily n-doped semiconductor zone 1 may be nearly constant between starting from the bottom side 12 of the heavily n-doped semiconductor zone 1 and as far as about d1'=40% to 80% of the thickness d1 of the heavily n-doped semiconductor zone 1 and may then gradually decrease towards the top side 11 of the heavily n-doped semiconductor zone 1 for the remaining thickness of the semiconductor zone 1. In FIG. 7, the value of the n-dopant concentration at the top side 11 is designated with c2. For instance, c2 may be less than or equal to 0.5·c3 (50%), less than or equal to 0.3·c3 (30%), or less than or equal to 0.1·c3 (10%). The decrease may be e.g. from c2=100% at the bottom side 12 of heavily n-doped semiconductor zone 1 to c2 at the top side 11 of the heavily n-doped semiconductor zone 1.

Figure 8:
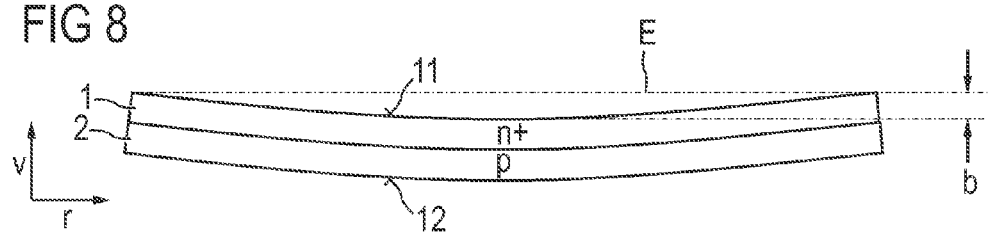
FIG. 8 illustrates the wafer bow of an n-doped semiconductor zone that is arranged on a p-doped carrier.

As illustrated in FIG. 8, the present invention allows for the wafer bow b in particular of a n-doped semiconductor zone 1 that has a large diameter D1 and that is arranged on a p-doped carrier 2 to be kept at acceptable low values. For instance, the wafer bow b may be less than or equal to 50 µm, less than or equal to 30 µm, or less than or equal to 20 µm. The kind of electrically active and/or inactive dopants of the first semiconductor zone 1 and the p-doped carrier 2 are chosen to appropriately interact with the semiconductor base material such that the required low wafer bow b is achieved. The above mentioned upper limits of the wafer bow b may apply to any wafer that has a large diameter D1, that is, at least 200 mm, at least 250 mm, at least 300 mm or at least 450 mm and that comprises an n-doped semiconductor zone 1 that is arranged on a p-doped carrier 2. In the sense of the present invention, the wafer bow b is the maximum deviation of the semiconductor zone's 1 top side 11 from a plane E that is virtually placed on the top side 11. Thereby, the top side 11 is that side 11 of the n-doped semiconductor zone 1 that faces away from p-doped carrier 2.

Figure 9A:
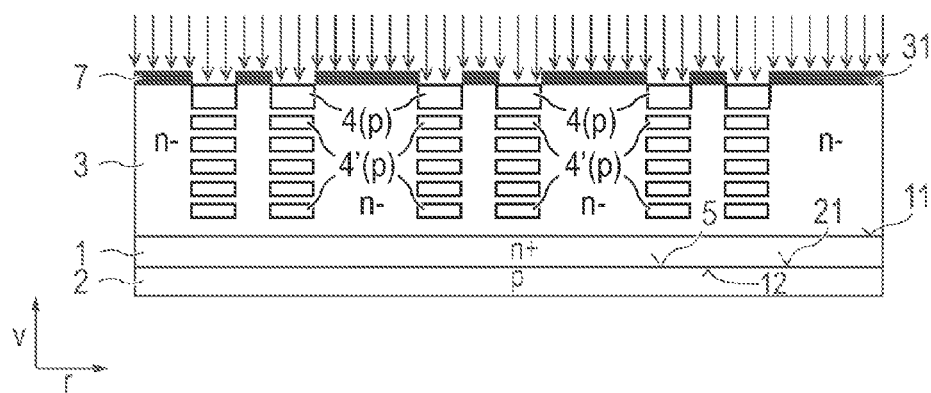
FIGS. 9A and 9B illustrates different steps of a method for producing a superjunction device.
Figure 9B:
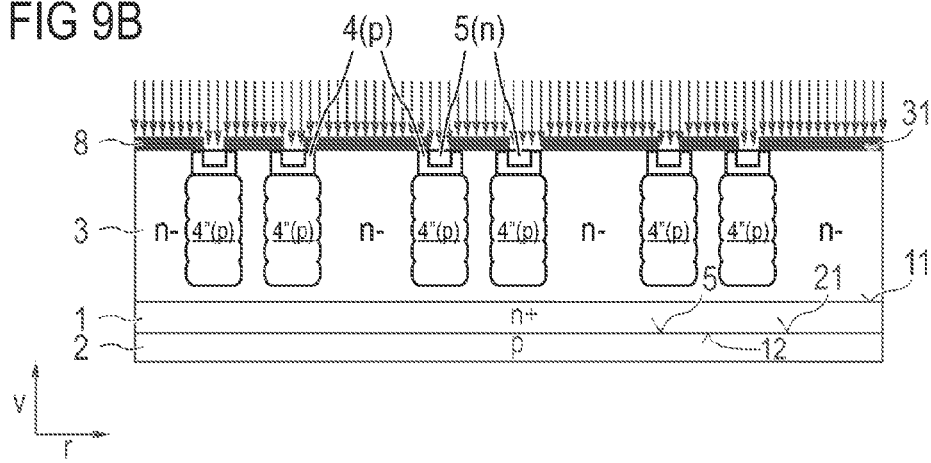

FIGS. 9A and 9B, which correspond to FIGS. 2B and 2C, respectively, illustrate a method for producing a semiconductor component superjunction device. The method is substantially identical to the method illustrated above with reference to FIGS. 2A to 2D. The sole difference is that in order to realize a compensation structure required for the superjunction device, additional columns 4″ (FIG. 9B) are produced in the epitaxial layer that comprises the drift zone 3 so that the columns 4″ are embedded in the drift zone 3. Each of the columns 4″ has a conduction type opposite to the conduction type of the drift zone 3 and contacts at least one of the body zones 4.

For the production of the columns 4″, a number of areas 4' (FIG. 9A) having a conduction type opposite to the conduction type of the drift zone 3 may be produced in the drift zone 3 so as to form stacks in which the areas 4' are arranged—in a vertical direction v—one upon the other but spaced distant from one another. To this, the areas 4' embedded in the drift zone 3 may be produced by growing an epitaxial layer 3 as explained with reference to FIG. 2A but by interrupting the epitaxy several times in order to implant dopants into the (uncompleted) epitaxial layer 3 in the same way as explained above with reference to FIG. 2B. That is, the layers of the area 4' may be produced in the same manner as the body zones 4. After a subsequent annealing step, the areas 4' of the stack grow together so as to form a column 4″ as shown in FIG. 9B.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents. In particular, the features/method steps of different embodiments may be combined in an arbitrary manner unless the combination of certain features/method steps is technically impossible.

What is claimed is:

1. A method for producing a semiconductor arrangement, the method comprising:
   providing a semiconductor carrier of a second conduction type; and
   epitaxially growing a first semiconductor zone of a first conduction type complementary to the second conduction type on the semiconductor carrier, wherein:
      the first semiconductor zone comprises a semiconductor base material doped with a first dopant and with a second dopant;
      the first dopant and the second dopant are made of different substances;
      the first dopant and the second dopant are made of substances which are both different from the semiconductor base material;
      the first dopant is electrically active and causes a doping of the first conduction type in the semiconductor base material;
      the first dopant causes a decrease or an increase of a lattice constant of the first semiconductor zone; and
      the second dopant causes one or both of:
         a hardening of the first semiconductor zone; and
         an increase of the lattice constant of the first semiconductor zone if the first dopant causes a decrease, or a decrease of the lattice constant of the first semiconductor zone if the first dopant causes an increase.

2. The method of claim 1, wherein the semiconductor carrier comprises a second semiconductor zone of a second conduction type which is complementary to the first conduction type or identical to the first conduction type.

3. The method of claim 1, further comprising:
   removing the semiconductor carrier from the first semiconductor zone.

4. The method of claim 3, further comprising:
   forming a semiconductor component on the semiconductor carrier prior to the removal of the semiconductor carrier from the first semiconductor zone, wherein the first semiconductor zone or a part of the first semiconductor zone forms a part of the semiconductor component.

5. The method of claim 4, wherein the semiconductor component comprises an n-doped drain which is formed from the first semiconductor zone.

6. The method of claim 1, wherein the base material is silicon (Si) or silicon carbide (SiC), and wherein the first semiconductor zone comprises as dopants at least one of: arsenic (As); phosphorus (P); antimony (Sb); nitrogen (N); oxygen (O); and germanium (Ge).

7. The method of claim 1, further comprising:
    growing an epitaxial layer of the same conduction type as the first semiconductor zone on that side of the first semiconductor zone facing away from the semiconductor carrier; and
    forming a field stop zone in the epitaxial layer by a diffusion of electrically active dopants of the first semiconductor zone into the epitaxial layer, wherein a drift zone directly abuts the field stop zone on that side of the field stop zone facing away from the first semiconductor zone.

8. The method of claim 7, wherein the first semiconductor zone comprises P and As as dopants, wherein the field stop zone comprises P and As as dopants, wherein the drift zone comprises at least P as dopants, and wherein the drift zone comprises a section spaced distant from the first semiconductor zone and free of As.

\* \* \* \* \*